(12) United States Patent
Weimer

(10) Patent No.: US 7,407,892 B2
(45) Date of Patent: Aug. 5, 2008

(54) DEPOSITION METHODS

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 11/127,945

(22) Filed: May 11, 2005

(65) Prior Publication Data

US 2006/0258157 A1 Nov. 16, 2006

(51) Int. Cl.
*H01L 21/44* (2006.01)
*H01L 21/31* (2006.01)

(52) U.S. Cl. .............. 438/761; 438/685; 438/758; 257/E21.16

(58) Field of Classification Search ........... 438/685, 438/761, 758; 257/E21.159, E21.16
See application file for complete search history.

(56) References Cited

U.S. PATENT DOCUMENTS

| | | | |
|---|---|---|---|
| 5,020,475 A * | 6/1991 | Crabb et al. ............ | 118/719 |
| 6,042,652 A * | 3/2000 | Hyun et al. ............ | 118/719 |
| 7,220,312 B2 * | 5/2007 | Doan et al. ............ | 117/84 |
| 2002/0147611 A1 | 10/2002 | Bondeslam et al. | |
| 2002/0157611 A1 | 10/2002 | Bondestam et al. | |
| 2002/0162506 A1 | 11/2002 | Sneh et al. | |
| 2002/0173164 A1* | 11/2002 | Raffin et al. ............ | 438/761 |
| 2003/0049372 A1* | 3/2003 | Cook et al. ............ | 427/248.1 |
| 2003/0060030 A1* | 3/2003 | Lee et al. ............ | 438/517 |
| 2004/0152304 A1 | 8/2004 | Sarigiannis | |

FOREIGN PATENT DOCUMENTS

WO WO 2004/015742 A2 2/2004
WO PCT/US2006/017063 5/2006

* cited by examiner

*Primary Examiner*—Michael S. Lebentritt
*Assistant Examiner*—Seahvosh J Nikmanesh
(74) *Attorney, Agent, or Firm*—Wells St. John P.S.

(57) ABSTRACT

The invention includes deposition methods and apparatuses which can be utilized during atomic layer deposition or chemical vapor deposition. A heated surface is provided between a stack of semiconductor substrates and a precursor inlet, and configured so that problematic side reactions occur proximate the heated surface rather than proximate the semiconductor substrates. The precursor inlet can be one of a plurality of precursor inlets, and the heated surface can be one of a plurality of heated surfaces.

6 Claims, 13 Drawing Sheets

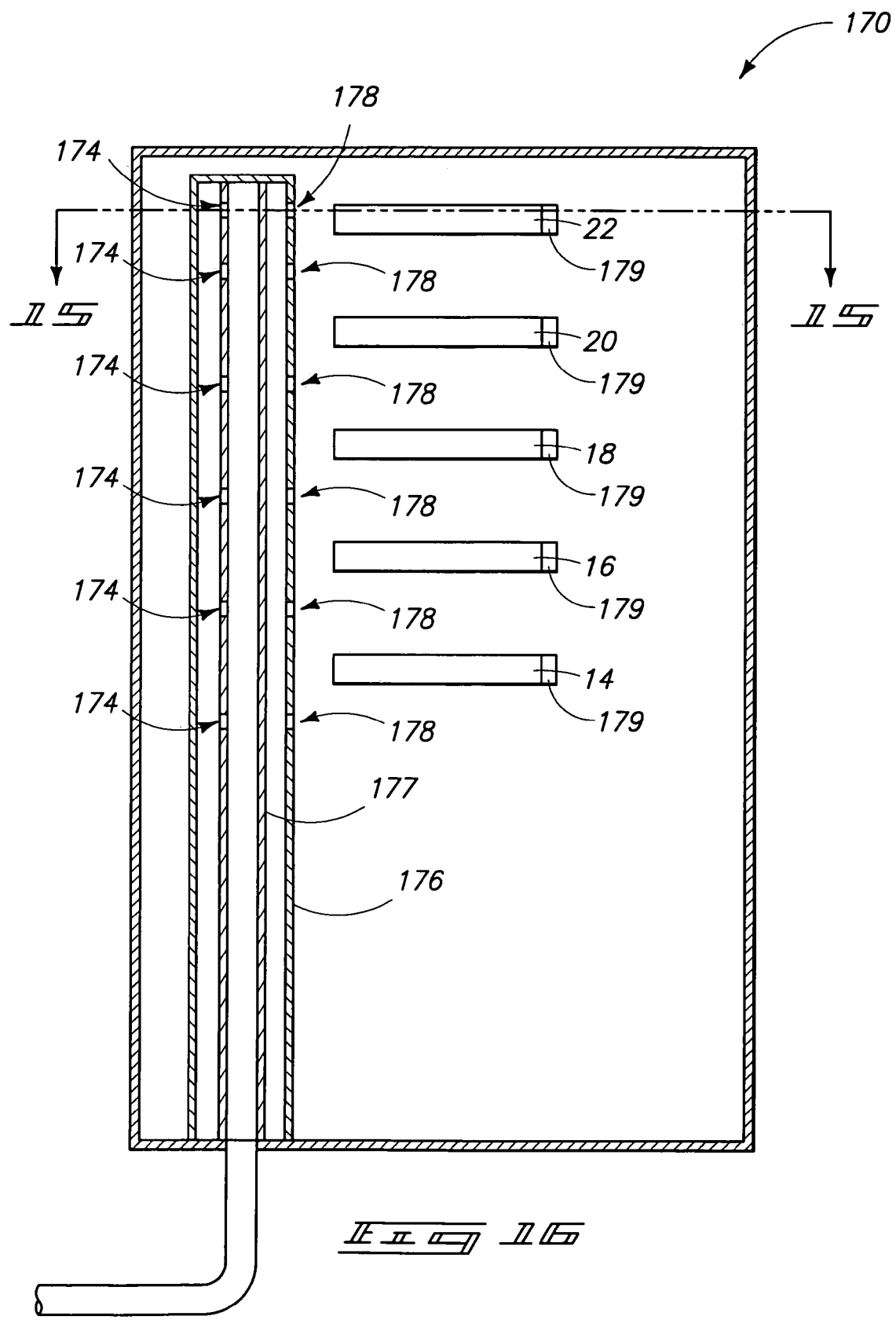

DEPOSITION METHODS

TECHNICAL FIELD

The invention pertains to deposition methods and to deposition apparatuses. In particular aspects, the invention pertains to atomic layer deposition methods and apparatuses, and/or to chemical vapor deposition methods and apparatuses.

BACKGROUND OF THE INVENTION

Some background on ALD and CVD may assist the reader in understanding the present disclosure. ALD is generally considered to include processes in which precursors alternately react at an exposed surface in a self-limiting manner with no direct interaction except for the exposed surface. CVD is generally considered to include processes in which one or more precursors react above a surface to form a material that ultimately deposits over the surface in a continuous deposition or not self-limiting manner. However, the distinction between ALD and CVD processes often blurs in actual applications so that processes that primarily proceed by ALD may still have some CVD-type contribution.

Typically, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Deposition methods, such as atomic layer deposition (ALD) and chemical vapor deposition (CVD) methods, are commonly utilized to form material during semiconductor device fabrication. The deposition methods can be conducted to process a single semiconductor wafer at a time, or to process multiple semiconductor wafer at one time. It can be desired to process batch of multiple semiconductor wafer in order to increase throughput of a fabrication process, however, such can also lead to difficulties in forming uniform thicknesses of material across the semiconductor wafer.

FIGS. 1 and 2 illustrate an exemplary deposition apparatus 10 which can be utilized for either an ALD process or a CVD process. Although FIGS. 1 and 2 are illustrating the same apparatus, the method of illustration is different so that the apparatus is shown in a more generalized manner in FIG. 2 than in FIG. 1. For instance, FIG. 1 shows that the apparatus comprises a cylindrical shape with a liner 17 contained within an outer wall 15; whereas FIG. 2 does not provide specific detail about the shape of the apparatus or the presence of the liner. Although FIG. 1 has more detail than FIG. 2, it is to be understood that FIG. 1 is still a generalized diagram and that other features can be included in addition to those shown in FIG. 1. For instance, heating coils can be included in the apparatus.

The apparatus 10 comprises a reaction chamber 12 having a plurality of semiconductor wafer substrates 14, 16, 18, 20 and 22 retained therein. Such substrates would be retained within a substrate support structure which is not shown in the diagrammatic views of FIGS. 1 and 2.

An inlet 24 and outlet 28 extend into the chamber 12. In operation, precursor is flowed into the reaction chamber through the inlet, and substances (for instance, reaction by-products, unreacted precursor, etc.) are exhausted out of the reaction chamber through the outlet. The precursor can be considered to flow in a stream 30 (such stream can also be referred to as a bulk flow of the precursor). Valves (not shown) can be provided to control flow of matter into and out of the reaction chamber. Also, there can be various pumps and other fluid-flow control devices (not shown) associated with apparatus 10 for assisting in flowing matter into and out of the reaction chamber.

In the exemplary apparatus of FIGS. 1 and 2, precursor flow into the chamber is directed upwardly through the chamber along lateral edges of the substrates 14, 16, 18, 20 and 22. The precursor then diffuses between the substrates (with such diffusion being diagrammatically illustrated as flow of stream 30 over and between the substrates in FIG. 2) and forms material (not shown in FIGS. 1 and 2) ultimately deposited over surfaces of the substrates 14, 16, 18, 20 and 22.

In CVD processes, it can be desired that a rate of reaction of precursor to form deposited material be relatively slow so that the material is relatively evenly distributed across surfaces of substrates 14, 16, 18, 20 and 22 as the precursor mixture diffuses over and between the substrates. In other words, it can be desired that a rate of reaction of precursor to form deposited material be optimal for the diffusion rate of the precursor over and between the semiconductor wafer substrates. If the rate of reaction is too fast, deposited material will build up much faster at the edges of the substrates than at central locations of the substrates.

Due to the desire to have relatively slow formation of deposited material, relatively slow reacting precursors will typically be utilized in batch CVD processes. As an example, a silicon nitride deposit can be formed utilizing dichlorosilane and ammonia as precursors, or can be formed utilizing silane and ammonia as precursors. If a single wafer is treated by a CVD process, it will frequently be silane and ammonia utilized as precursors, in that such are the fast-reacting precursors and accordingly utilization of such precursors can increase throughput. Alternatively, if a batch CVD process is utilized it will typically be dichlorosilane and ammonia utilized as precursors in order to enable a more uniform coating to be deposited across the multiple substrates of the batch than could be achieved with the faster reacting precursors.

Even if relatively slow reacting precursors are utilized, there can be problems with the uniformity of deposition achieved across a semiconductor wafer substrate surface during a batch CVD process. For instance, FIG. 3 shows the semiconductor wafer substrate 20 after a coating (in other words, deposited material) 50 has been formed across an upper surface of the substrate. The substrate 20 can be considered to comprise a central region 21, and an edge region 23 surrounding the central region. Dashed lines 25 are illustrated in FIG. 3 to diagrammatically represent boundaries between the central region 21 and the edge region 23. The coating 50 is shown to be formed significantly thicker in the edge region than in the central region. Such non-uniformity of deposition of coating 50 can significantly complicate further processing.

FIGS. 4-7 describe a prior art method which has been developed to address the problem illustrated in FIG. 3. Referring initially to FIG. 4, such shows an assembly 63 comprising a semiconductor wafer substrate 60 at a preliminary processing stage. As will be known to persons of ordinary skill in the art, a semiconductor wafer substrate can comprise any of numerous semiconductor materials, and frequently will comprise, consist essentially of, or consist of silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The substrate 60 of assembly 63 is retained by support pins 61 joined to rails 59. The assembly 63 also includes a boat 62 (which can also be referred to as a ringboat) forming a physical extension proximate the substrate, and supported by the pins 61. The boat 62 will commonly comprise, consist essentially of, or consist of quartz. The boat 62 and substrate 60 can be considered to form a sub-assembly 58, which is shown in top view in FIG. 5.

A gap 65 is shown between the substrate 60 and boat 62 in the views of FIGS. 4 and 5 to assist the reader in distinguishing the boat from the substrate. In practice the boat can be provided very close to the substrate, or even in contact with an edge of substrate.

The top view of FIG. 5 shows that the semiconductor wafer substrate 60 can comprise a circular configuration, and that the boat 62 can be an annular ring provided around the substrate.

FIG. 6 shows the construction 58 after it has been subjected to a batch CVD process of the type described with reference to FIG. 3. Such has formed the deposit 50 across an upper surface of substrate 60, and across an upper surface of boat 62.

Referring next to FIG. 7, the boat 62 (FIG. 6) can be removed to leave the substrate having a relatively uniform layer of the deposit 50 thereon.

A problem with the processing of FIGS. 4-7 is that the boat is an added expense and has a limited lifetime.

Problems similar to those discussed above with reference to FIG. 3 occur in ALD processes. In theory, if processes were truly entirely ALD such problems should not occur in that deposition occurring during ALD should be self-limiting. Accordingly, deposits should form as a single monolayer across a substrate surface, and there should not be problems with build-up of deposit at edges of the substrate. However, ALD processes frequently have a CVD-type component, and such component can lead to the problematic edge build-up comparable to the build-up discussed above with reference to FIG. 3 for a CVD process.

Although the problems of FIG. 3 are discussed relative to batch processes, it is to be understood that similar problems can also occur in single wafer processes.

The problem of FIG. 3 is but one of several problems that can occur during utilization of a deposition apparatus, such as the exemplary apparatus of FIGS. 1 and 2. Another problem that can occur is that precursor can become depleted within the flow 30 as the flow migrates through the reaction chamber of the apparatus.

It would be desirable to develop methods and apparatuses which can alleviate, and preferably prevent, the edge build-up problems discussed above with reference to FIG. 3 for CVD and ALD processes. It would be further desirable to develop methods and apparatuses which can address some of the other problems associated with deposition processes, such as, for example, the problem of precursor depletion that can occur in batch processes.

SUMMARY OF THE INVENTION

In one aspect, the invention includes a deposition method. At least one semiconductor wafer substrate is provided within a reaction chamber of a deposition apparatus. The semiconductor wafer substrate is heated to a first temperature within the reaction chamber. A surface is provided within the reaction chamber that is heated to at least about the first temperature. The surface is spaced from the semiconductor wafer substrate by a distance. Deposition material is flowed toward the surface and thereafter toward the semiconductor wafer substrate. The deposition material interacts with the heated surface so that side reactions occur. The side reactions generate one or more problematic products. The distance between the heated surface and the semiconductor wafer substrate is sufficient so that substantially none of the one or more problematic products reaches the semiconductor wafer substrate.

In one aspect, the invention encompasses another deposition method. A deposition apparatus is provided which has one or more semiconductor wafer substrates retained therein. The apparatus includes a reaction chamber, an inlet port configured for injecting fluid (specifically, a precursor-containing fluid) into the reaction chamber, and a heated surface within the reaction chamber and proximate the inlet port. The one or more semiconductor wafer substrates are within the reaction chamber. The one or more semiconductor wafer substrates are heated to a first temperature within the apparatus. The heated surface is heated to a second temperature which is at least about the same as the first temperature. A bulk flow of one or more precursors is provided through the inlet port and toward the heated surface, and thereafter toward the one or more semiconductor wafer substrates. The bulk flow of the one or more precursors interacts with the heated surface for a sufficient time so that undesired side reactions occur prior to the bulk flow migrating beyond the heated surface toward the one or more semiconductor wafer substrates. In some aspects, the inlet port is one of a plurality of inlet ports, and the heated surface is one of a plurality of heated surfaces.

In one aspect, the invention encompasses a deposition apparatus. The apparatus includes a reaction chamber, a substrate holder within the reaction chamber, an inlet port extending into the reaction chamber, and a heated surface within the reaction chamber and proximate the inlet port. The substrate holder is configured for retaining at least one semiconductor substrate within the chamber. The inlet port, the heated surface, and the substrate holder are configured such that the bulk flow of one or more precursors into the reaction chamber is through the inlet port and directed by the inlet port to interact with the heated surface prior to reaching any substrate retained by the substrate holder. In some aspects, the inlet port is one of a plurality of inlet ports, and the heated surface is one of a plurality of heated surfaces.

BRIEF DESCRIPTION OF THE DRAWINGS

Preferred embodiments of the invention are described below with reference to the following accompanying drawings.

FIG. 16 is a diagrammatic, cross-sectional side view of the deposition apparatus of FIG. 15.

DETAILED DESCRIPTION OF THE PREFERRED EMBODIMENTS

Figure 1:
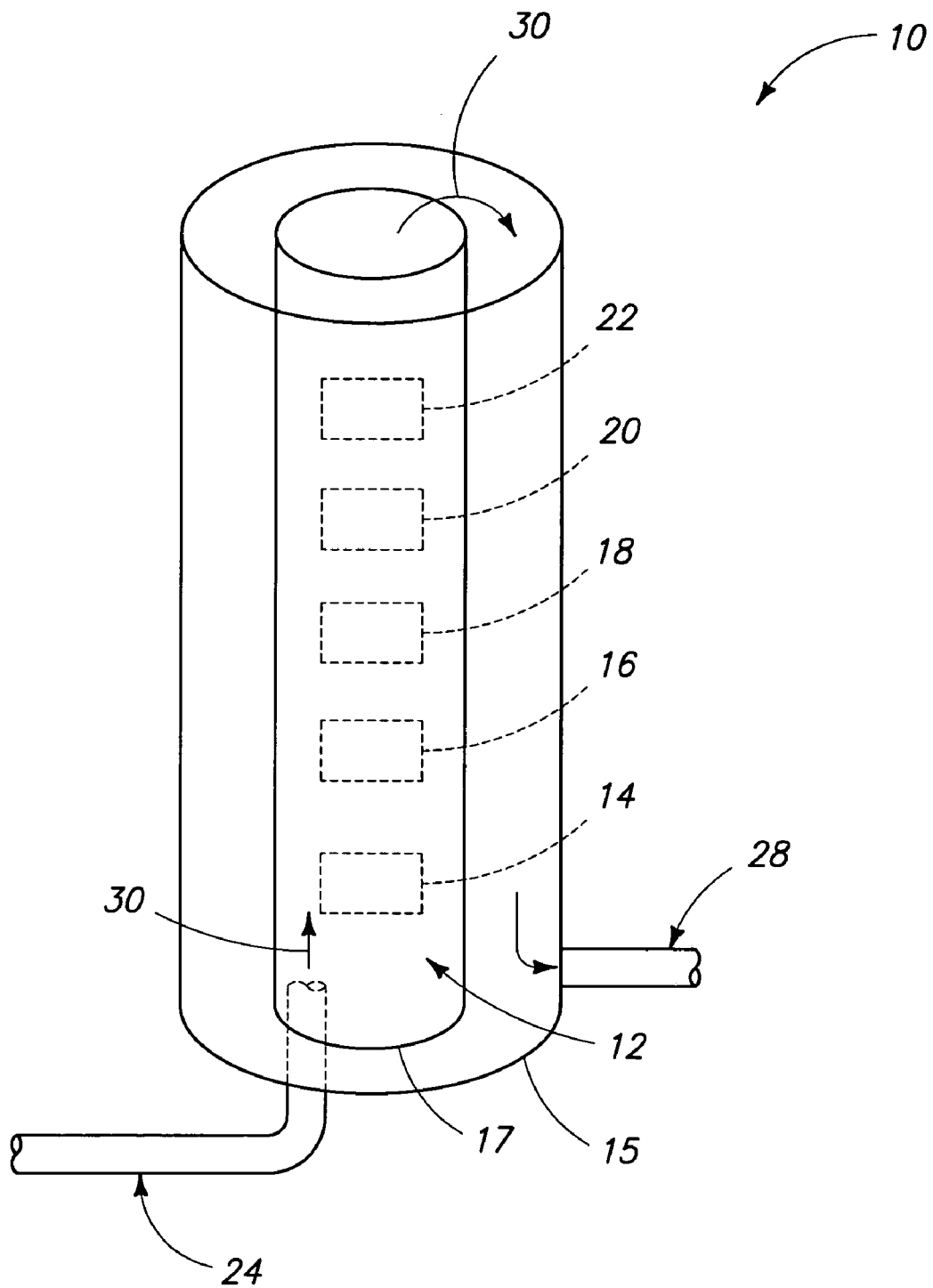
FIG. 1 is a diagrammatic, cross-sectional view of a prior art deposition apparatus having a plurality of substrates retained therein.

This disclosure of the invention is submitted in furtherance of the constitutional purposes of the U.S. Patent Laws "to promote the progress of science and useful arts" (Article 1, Section 8).

The invention includes incorporation of at least one heated surface into a deposition chamber so that injected fluids interact with the heated surface prior to reaching semiconductor wafer substrates. The semiconductor wafer substrates are heated to conventional temperatures for a deposition process, and the heated surface is heated to at least about the temperature of the semiconductor wafer substrates. Specifically, the heated surface is heated to a sufficient temperature so that undesired thermal reactions that would occur proximate the heated substrates instead occur proximate the heated surface. Thus, the reference to the heated surface being heated to "at least about the temperature of the semiconductor substrates" (or alternatively, at least approximately the temperature of the semiconductor substrates) is used to indicate that the heated surface is heated to a sufficient temperature to induce thermal reactions that would otherwise be induced by the heated substrates.

The fluids injected into the reaction chamber would typically be gases, and would typically include one or more precursors mixed with carrier gas. The heated surface can be any suitable material, and in particular aspects will comprise ceramic material or metallic material. Although methods and apparatuses of the present invention can be utilized with single wafer tools or batch reactors, it can be particularly advantageous to incorporate aspects of the present invention into applications utilizing batch reactors. The invention can be utilized with either CVD processes or ALD processes, and can be utilized to reduce or alleviate the deposition non-uniformity discussed above with reference to FIG. 3.

In particular aspects, the invention is utilized with ALD processes to improve uniformity of deposition. As discussed previously, the non-uniformity of deposition of the type discussed above with reference to FIG. 3 should theoretically not occur with a pure ALD process. Instead, the process should be self-limiting so that a monolayer is formed across all reactive surfaces exposed to ALD precursor. In practice, however, it is found that many ALD processes have a CVD component, and accordingly the thickness variation discussed above with reference to FIG. 3 is found to occur in ALD processes.

The CVD problem in the ALD processes can have numerous causes, including, for example, insufficient pumps/purges, gas decomposing prior to getting to a wafer, contaminants present within ALD precursor gases, and/or by-products of the ALD reaction.

In typical deposition processes, substrate surfaces are heated to a temperature exceeding the average temperature within a deposition apparatus. One aspect of the invention is a recognition that the CVD aspects of ALD processes appear to be thermally induced as precursor materials encounter heated substrate surfaces. Exemplary aspects of the invention include provision of at least one heated surface within the reaction chamber along the precursor flow path and upstream of the substrate surfaces. The heated surface is utilized to thermally induce problematic reactions upstream of the semiconductor substrates, and to substantially or entirely exhaust the precursor stream of problematic components before the stream reaches the semiconductor substrates.

Aspects of the present invention can significantly reduce CVD-type problems in particular types of ALD applications. For instance, if the CVD-type problems result from precursor materials decomposing when exposed to a heat associated with semiconductor wafers, the methodologies of the present invention can significantly reduce the CVD-type problems. Also, if the CVD-type problems result from contaminants present in ALD precursor gases, the methodologies of the present invention can significantly reduce the CVD-type problems.

Exemplary ALD precursors which can have undesired CVD-type side reactions leading to material build-up are tetrakis(dimethylamido) hafnium (TDMAH), tetrakis(ethylmethylamino)hafnium (TEMAH) and tetrakis(methylethylamino)hafnium (TMEAH), which are commonly used for deposition of hafnium. Such precursors can react with a heated semiconductor wafer substrate to form a hafnium-containing component, and to form one or more other components that may undergo CVD-type reactions. The hafnium-containing component can interact with the semiconductor wafer substrate surface to form a desired ALD deposit on such surface, and simultaneously the other components can undergo CVD-type reactions to form additional deposit that accumulates over the surface. Such additional deposit can accumulate faster over edges of the substrate than over a central region of the substrate to lead to the problem discussed above with reference to FIG. 3. In a particular aspect of the present invention, a heated surface is provided proximate a precursor inlet so that CVD-type side reactions occur at a suitable distance from the semiconductor wafer substrates such that any problematic products from the CVD-type side reactions do not reach the semiconductor wafer substrates, or at least so that substantially all of the problematic products do not reach the semiconductor wafer substrates (with the term "substantially all" meaning that the amount of problematic product is significantly reduced, and in some aspects can mean that there is no detectable problematic product reaching the semiconductor wafer substrates).

In other aspects of the invention, a precursor which generally undergoes purely ALD-type reactions is contaminated with another precursor which undergoes CVD-type reactions. The ALD-type reactions and CVD-type reactions are enhanced when the precursor mixture reaches the heated environment of the semiconductor wafer substrate surfaces within a reaction chamber. Accordingly, the CVD-type reactions occurring from the contaminant form deposits proximate the. semiconductor wafer substrates, and such deposits can have the non-uniformity of deposition discussed above with reference to FIG. 3. In such aspects, the present invention can comprise provision of a heated surface proximate the precursor inlet so that the CVD-type side reactions occur at the heated surface and at a sufficient distance from the semiconductor wafer substrates so that problematic products produced by such side reactions do not reach the semiconductor wafer substrates.

Although the specific aspects of the invention have been described thus far with reference to ALD processes, it is to be understood that the invention can also have application to CVD processes. For instance, a CVD reactant that undergoes a desired slow reaction to form a deposit can be contaminated with another reactant that undergoes a fast reaction to form the deposit, and the contaminant can increase the problematic effect discussed above with reference to FIG. 3.

An exemplary CVD process is discussed above in the Background section of this disclosure as a process utilizing dichlorosilane and ammonia to form silicon nitride in CVD processes utilizing batch reactors. As also discussed above, it is frequently not desired to utilize silane and ammonia to form silicon nitride in batch reactors due to the silane reacting too fast with the ammonia and thereby causing too much of the effect discussed with reference to FIG. 3.

Figure 3:
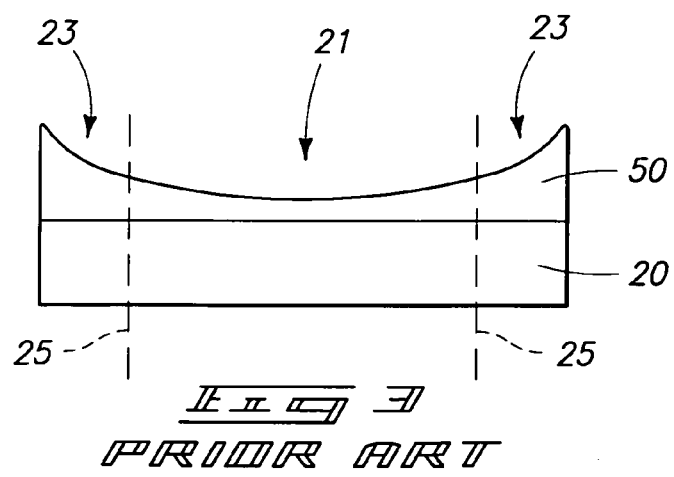
FIG. 3 is a diagrammatic, cross-sectional view of a semiconductor wafer substrate having a material deposited thereover.
Figure 4:
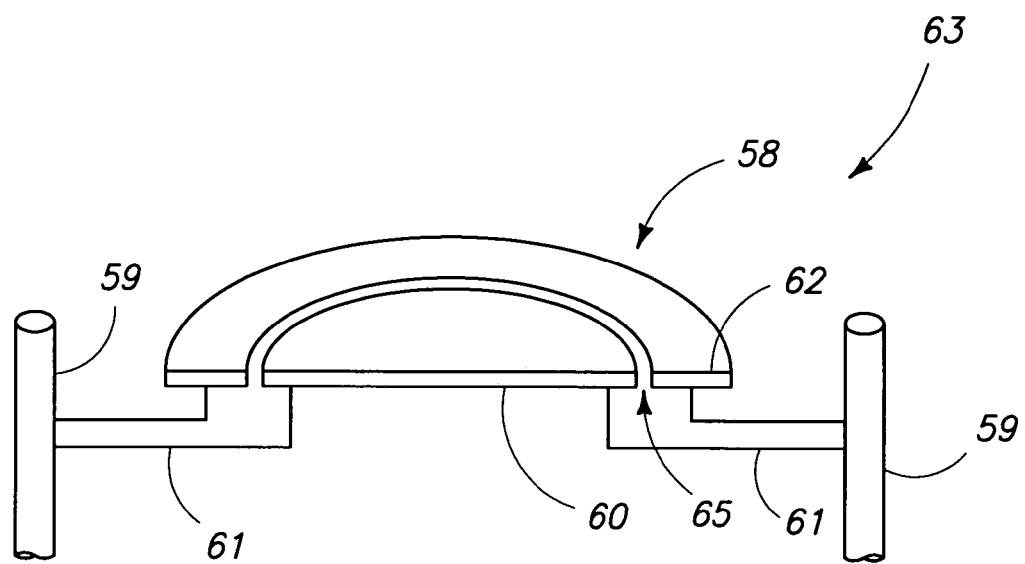
FIG. 4 is a diagrammatic, cross-sectional view of an assembly comprising a semiconductor wafer substrate and a ringboat.
Figure 5:
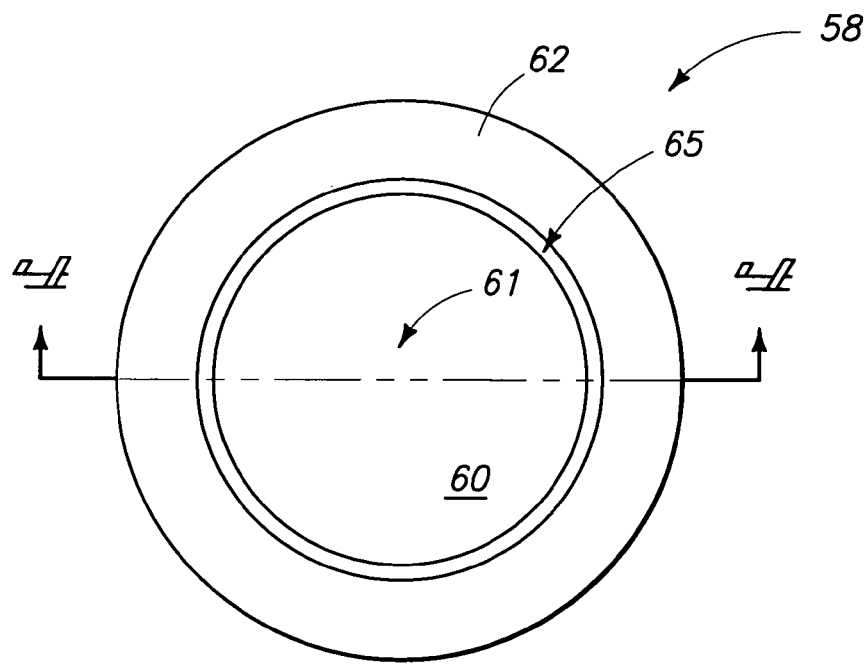
FIG. 5 is a top view of a portion of the FIG. 4 assembly, with a segment of the FIG. 4 cross-section being along the line 4-4 of FIG. 5.
Figure 6:
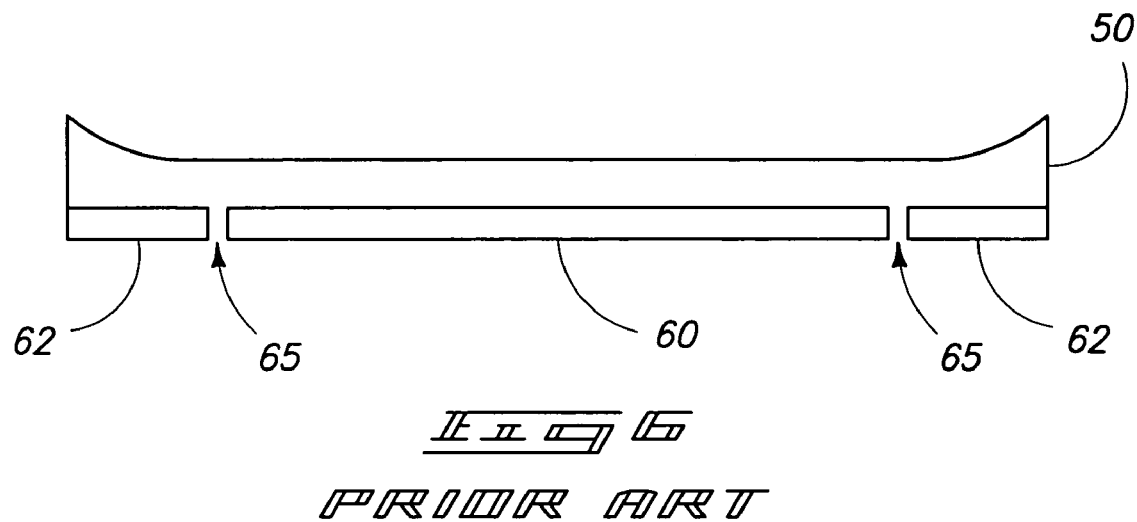
FIG. 6 is a diagrammatic, cross-sectional view of a portion of the FIG. 4 assembly shown at a processing stage after a deposit has been formed over the substrate and ringboat.
Figure 7:
FIG. 7 is a diagrammatic, cross-sectional view of the FIG. 6 assembly shown after removal of the ringboat.

If the relatively slow reacting CVD material dichlorosilane is contaminated with the relatively fast reacting material silane, the problem of FIG. 3 will occur during the formation of silicon nitride from the contaminated material. Accordingly, there will be a large excess of silicon nitride formed at edges of treated semiconductor substrates relative to the amount formed in central regions of the semiconductor substrates.

The substrates within a chamber are typically heated, and the temperature within the majority of the reaction chamber is low enough so that CVD reactions occur primarily proximate the heated substrates. The problematic CVD reactions are thus thermally accelerated by the heated substrates.

In some aspects of the present invention, a heated surface is provided proximate a precursor inlet in a CVD reactor so that contaminating materials are thermally activated to react at the heated surface to produce problematic products. The heated surface is provided to be an appropriate distance from semiconductor wafer substrates so that the problematic products do not reach the semiconductor wafer substrates, or at least so that substantially none of the problematic products reach the semiconductor wafer substrates. If multiple precursor inlets are present in a particular reaction chamber design, multiple heated surfaces can be provided so that some, and in some aspects all, of the precursor inlets have a heated surface paired therewith.

Specific reactor designs which can be utilized in accordance with various exemplary aspects of the present invention are described with reference to FIGS. 8-16.

Figure 8:
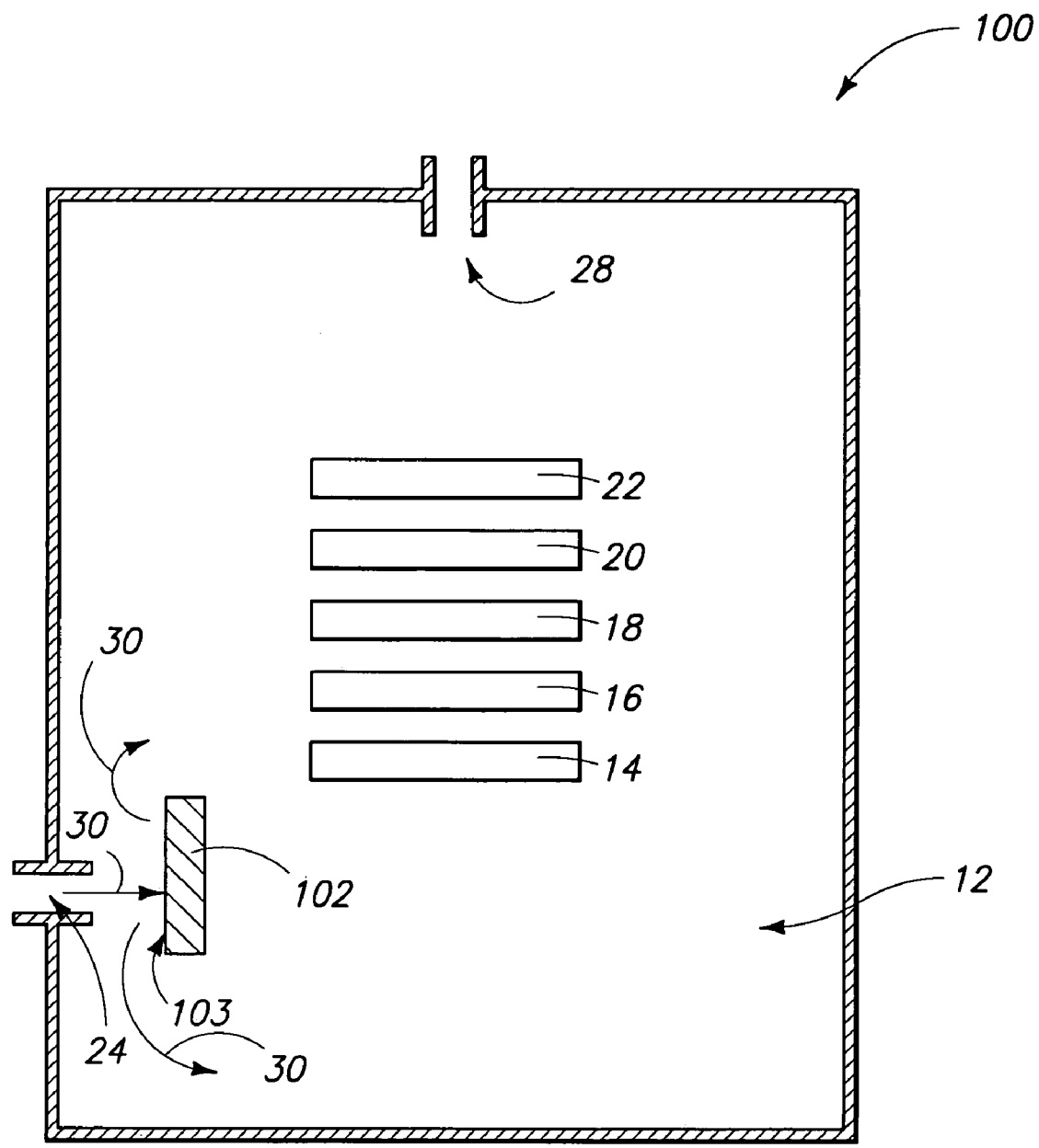
FIG. 8 is a diagrammatic, cross-sectional view of a deposition apparatus that can be utilized in accordance with an aspect of the present invention, and which has a plurality of semiconductor wafer substrates retained therein.

Referring to FIG. 8, a deposition apparatus 100 configured in accordance with an aspect of the present invention is illustrated. Similar numbering will be utilized in describing the apparatus 100 as was utilized in describing the prior art apparatus of FIGS. 1 and 2, where appropriate.

The apparatus 100 comprises the reaction chamber 12 described previously, and comprises semiconductor wafer substrates 14, 16, 18, 20 and 22 retained therein. The substrates would be retained with a substrate holder (not shown). The shown apparatus is a batch reactor, and accordingly is configured for treating a plurality of semiconductor wafer substrates simultaneously. It is to be understood, however, that aspects of the invention can also be applied to deposition methods utilizing apparatuses configured for single wafer treatment rather than batch wafer treatment.

The inlet 24 and outlet 28 are shown extending through sidewalls of the reaction chamber. The opening of the inlet from which precursor enters the chamber can be referred to as an inlet port. In operation, a stream 30 of deposition material (i.e., one or more deposition precursors) is flowed into the reaction chamber through the inlet, and reaction by-products as well as unreacted precursor are exhausted from the chamber through outlet 28.

Figure 2:
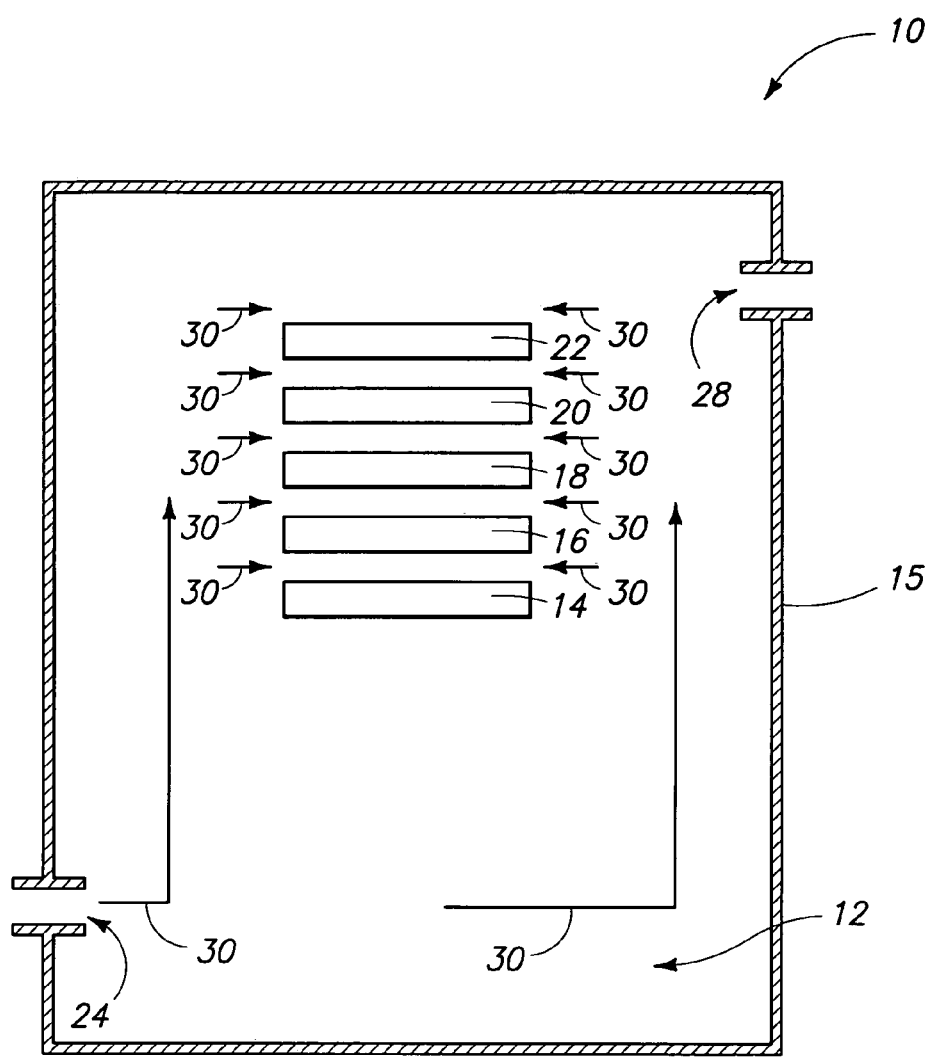
FIG. 2 is a more generalized, diagrammatic, cross-sectional view of the prior art deposition apparatus of FIG. 1 having the plurality of substrates retained therein.

The apparatus 100 of FIG. 8 differs from the apparatus 10 of FIGS. 1 and 2 in that a plate 102 is provided in front of the port of inlet 24. Accordingly, the deposition material first flows into contact with the plate, and then flows around the plate into the reaction chamber.

In a typical operation, the semiconductor wafer substrates 14, 16, 18 20 and 22 would be heated to a first temperature during a deposition process. The plate 102 would be heated to a temperature which is at least about the first temperature. The plate 102 has a surface 103 facing the inlet 24, and deposition material injected from the inlet port would impact the heated surface 103. Upon impact with the heated surface 103, various side reactions can occur within the deposition material.

For instance, if the deposition material is an ALD precursor having contaminants therein which undergo CVD-type side reactions at the temperature of the substrates 14, 16, 18, 20 and 22, such side reactions can occur when the precursor impacts surface 103. The side reactions will generate one or more problematic products. However, the distance from heated surface 103 to substrates 14, 16, 18, 20 and 22 is preferably sufficient so that substantially none of the problematic products reach the semiconductor substrates. Rather, the problematic products either fall out of the deposition material and onto a bottom of the reaction chamber, or form a deposit along the surface 103 of the heated plate.

In some aspects, the side reactions can occur not because of contaminants, but rather because an ALD precursor breaks down upon reaching surface 103 to form a first component which undergoes CVD-type reactions and a second component which will undergo ALD-type reactions. The component which undergoes ALD-type reactions can flow around the heated plate and toward the substrates 14, 16, 18, 20 and 22; whereas the component which undergoes CVD-type reactions will undergo such reactions proximate the plate to form problematic products which never reach the substrates 14, 16, 18, 20 and 22.

In another aspect, the deposition material which enters the reaction chamber in stream 30 can include a CVD precursor which undergoes a relatively slow CVD-type reaction, and a contaminating precursor which undergoes a relatively rapid CVD-type reaction. The contaminant can react upon being heated by surface 103 to form a problematic product which then falls out of the bulk stream 30 of deposition material so that the remaining stream is relatively pure in the CVD-precursor that undergoes relatively slow reaction by the time the stream of deposition material reaches substrates 14, 16, 18, 20 and 22.

The distance between plate 102 and the port of inlet 24 can be any suitable distance. In some aspects, it can be desired that the material impacting the surface 103 and flowing around the plate be traveling at about a diffusion rate of the material. Thus, the rate of migration of the material across the heated surface 103 will approximately match the rate that the material will diffuse across heated surfaces of substrates 14, 16, 18, 20 and 22. Any problematic side reactions that would occur due to the deposition material flowing across substrates 14, 16, 18, 20 and 22 will then have already occurred due to the material flowing across the surface 103.

If the amount of problematic reactant within the deposition material is limited (such as, for example, if the reactant is a contaminant, or is a thermally-generated breakdown by-product resulting from the deposition material reaching a temperature of the substrates) the problematic reactant will be removed from stream 30 before the stream reaches substrates 14, 16, 18, 20 and 22. Further, the distance between plate 102 and the substrates is preferably sufficient so that any problematic products generated near the plate do not reach the substrates. In some aspects, the distance between the plate and substrates is sufficient so that any reactant by-products generated by thermal breakdown of precursor proximate the plate 102 have time to react with one another and form products prior to reaching the substrates, and also so that such products have time to fall out of the flow 30 of deposition material prior to the flow reaching the substrates.

In some aspects, the flow of deposition material can be considered to be a bulk flow 30 of one or more precursors. The configuration of FIG. 8 can be considered to allow one or more precursors within such bulk flow to interact with heated surface 103 so that undesired side reactions occur prior to the bulk flow migrating beyond the heated surface toward the semiconductor wafer substrates 14, 16, 18, 20 and 22.

The configuration of FIG. 8 is but one of numerous suitable configurations for orienting a heated surface proximate an inlet port within a deposition apparatus. Another exemplary aspect of the invention is described with reference to FIG. 9.

Figure 9:
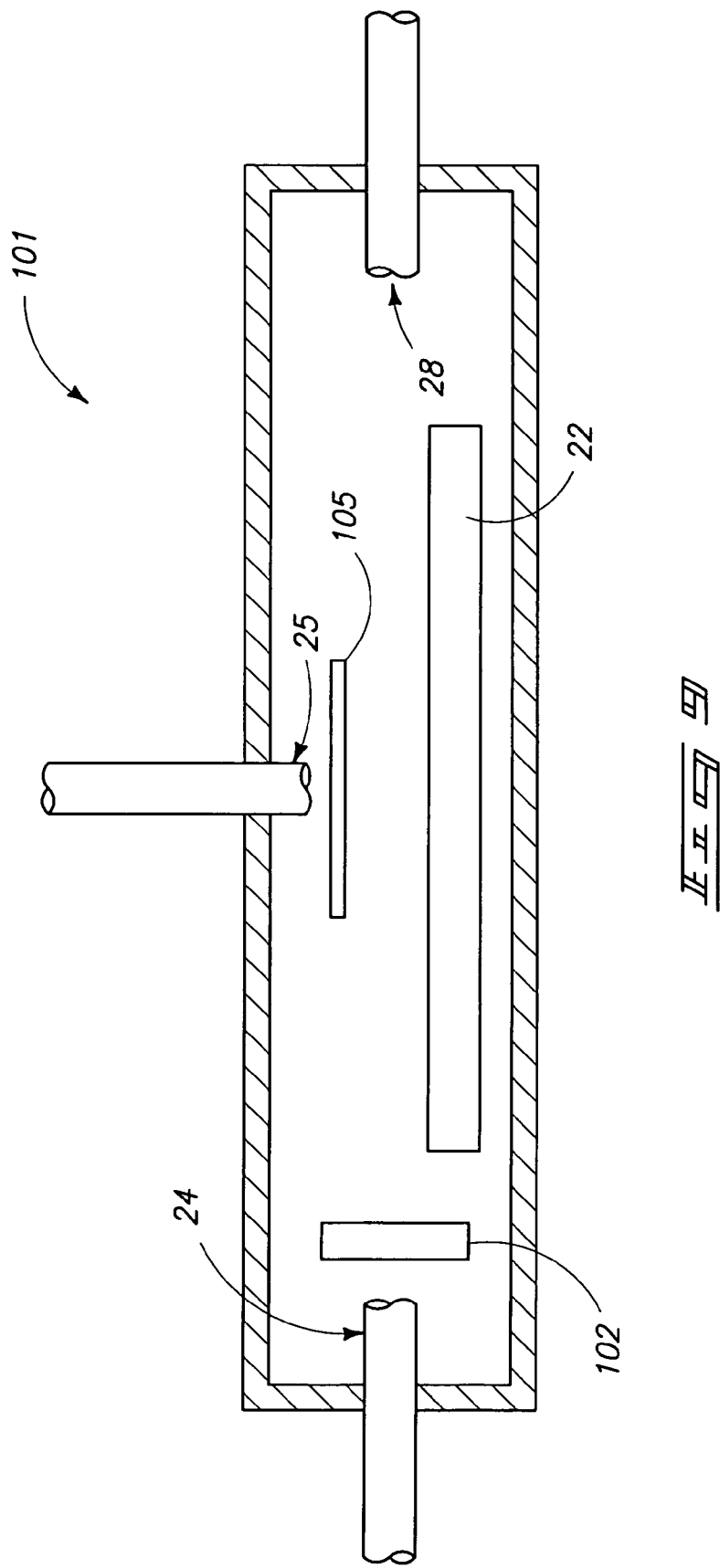
FIG. 9 is a diagrammatic, cross-sectional view of another deposition apparatus that can be utilized in accordance with an aspect of the present invention, and which has a semiconductor wafer substrate retained therein.

FIG. 9 shows an apparatus 101 in cross-sectional side view, and shows a semiconductor wafer substrate 22 retained within the apparatus. Apparatus 101 comprises a pair of inlets 24 and 25, and comprises an outlet 28. The apparatus also comprises a pair of heated plates 102 and 105, with the heated plate 102 being in front of a port of inlet 24, and the heated plate 105 being in front of a port of inlet 25. The heated plates 102 and 105 can be considered to be paired with inlets 24 and 25, respectively. The heated plates 102 and 105 can be the same size and composition as one another, or can differ from one another in one or both of size and composition.

The plates 102 and 105 of apparatus 101 can be used identically to the plate 102 of the FIG. 8 apparatus 100. Accordingly, plates 102 and 105 can be heated to temperatures at least approximately that of substrate 22, and be spaced from substrate 22 by a sufficient distance so that the plates can be utilized to substantially prevent problematic by-products and contaminants of deposition precursors from reaching substrate 22.

Figure 10:
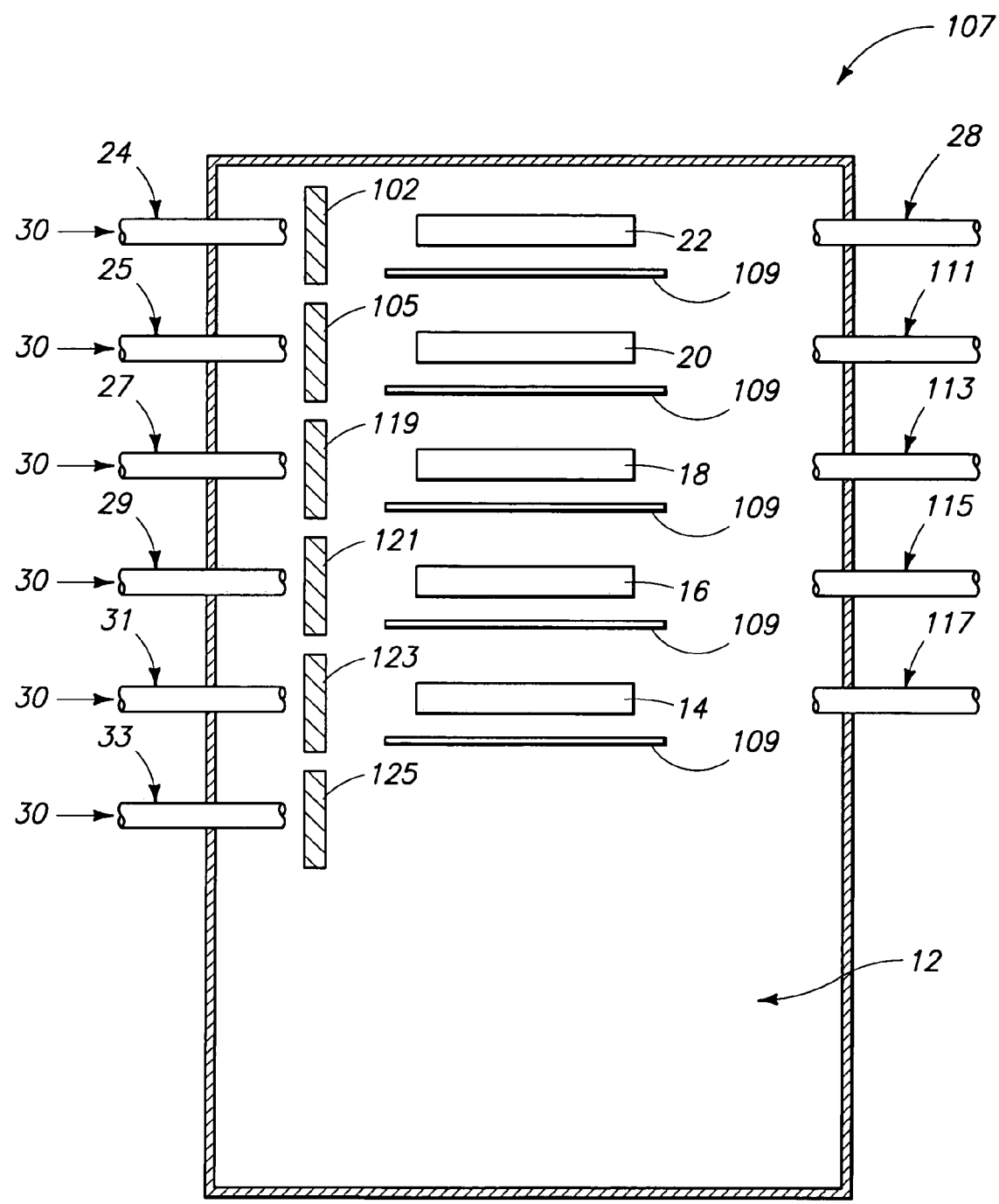
FIG. 10 is a diagrammatic, cross-sectional view of another deposition apparatus that can be utilized in accordance with an aspect of the present invention, and which has a plurality of semiconductor wafer substrates retained therein.

Yet another exemplary aspect of the invention is described with reference to FIG. 10 which shows an apparatus 107 in cross-sectional side view, and which shows semiconductor wafer substrates 14, 16, 18, 20 and 22 retained within the apparatus.

Apparatus 107 comprises a plurality of inlets 24, 25, 27, 29, 31 and 33; and comprises a plurality of outlets 28, 111, 113, 115 and 117. The number of outlets can be the same as the number-of-inlets, or different. In some aspects, multiple inlets can be provided together with only one outlet.

A plurality of heated plates 102, 105, 119, 121, 123 and 125 are in front of the inlets; and a plurality of baffles 109 (which can be dummy substrates having the size of the semiconductor wafers but formed of a different composition) are between the substrates. The heated plates 102, 105, 119, 121, 123 and 125 can be the same size and composition as one another, or at least some of them can differ from others in size and/or composition. Also, the baffles 109 can be the same size and composition as one another, or at least some of them can differ from others in size and/or composition.

The plates 102, 105, 119, 121, 123 and 125 of apparatus 107 can be used identically to the plate 102 of the FIG. 8 apparatus 100. Accordingly, plates 102, 105, 119, 121, 123 and 125 can be heated to temperatures at least approximately that of the substrates, and be spaced from the substrates by sufficient distances so that the plates can be utilized to substantially prevent problematic by-products and contaminants of deposition precursors in stream 30 from reaching the substrates. The use of multiple inlets (i.e., injection ports) can alleviate or even prevent prior art problems of precursor depletion that occur when only single inlets are utilized in batch reactors. The baffles 109 are optional, but can assist in directing flow of precursor around the substrates.

Figure 11:
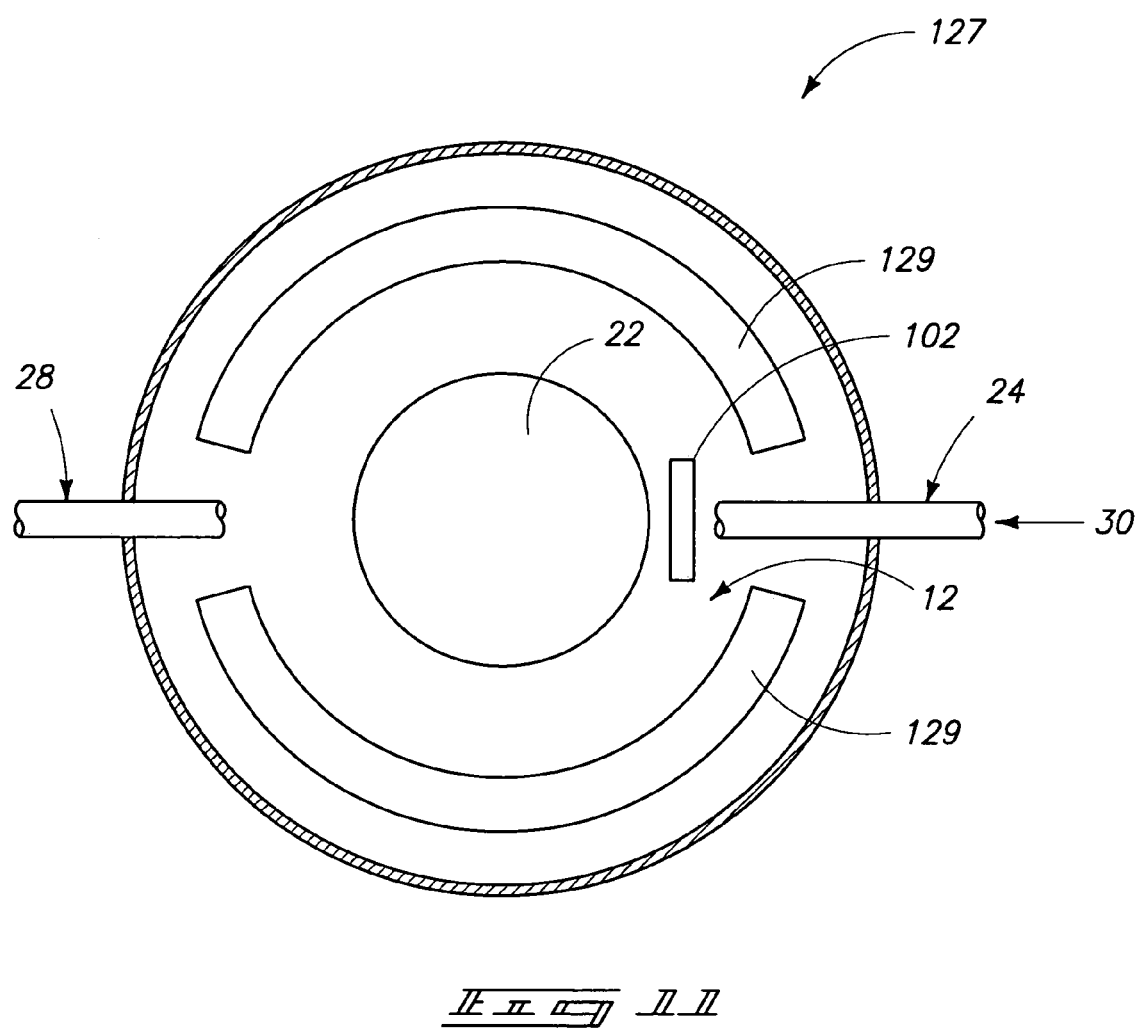
FIG. 11 is a diagrammatic, cross-sectional top view of another exemplary deposition apparatus which can be utilized in accordance with an aspect of the present invention, with the apparatus being shown having a semiconductor substrate retained therein.

Yet another exemplary aspect of the invention is described with reference to FIG. 11 which shows an apparatus 127 in cross-sectional top view, and which shows a semiconductor wafer substrate 22 retained within the apparatus.

Apparatus 127 comprises an inlet 24 and an outlet 28. The apparatus also comprises a heated plate 102 in front of the inlet, and comprises heating elements 129 around the substrate. The heating elements heat the substrate to a temperature, and the heated plate is preferably at a temperature equal to or greater than the temperature of the substrates so that the plate can be utilized for substantially preventing problematic by-products and contaminants of deposition precursors in stream 30 from reaching the substrate.

Yet another exemplary aspect of the invention is described with reference to FIGS. 12 and 13, which show an apparatus 150 in cross-sectional top view, and cross-sectional side view, respectively. The apparatus includes a reaction chamber 12 having an internal sidewall 151. A substrate holder 159 is within the apparatus, and semiconductor substrates 14, 16, 18, 20 and 22 are retained within the holder. An inlet 152 is within the reaction chamber and has a plurality of ports 154 therein. The inlet is configured so that a flow of one of more precursors in a stream 30 is directed toward the sidewall 151. The sidewall can be heated, and accordingly can correspond to a heated surface having a function analogous to the function discussed above with reference to the surface 103 of plate 102.

Figure 12:
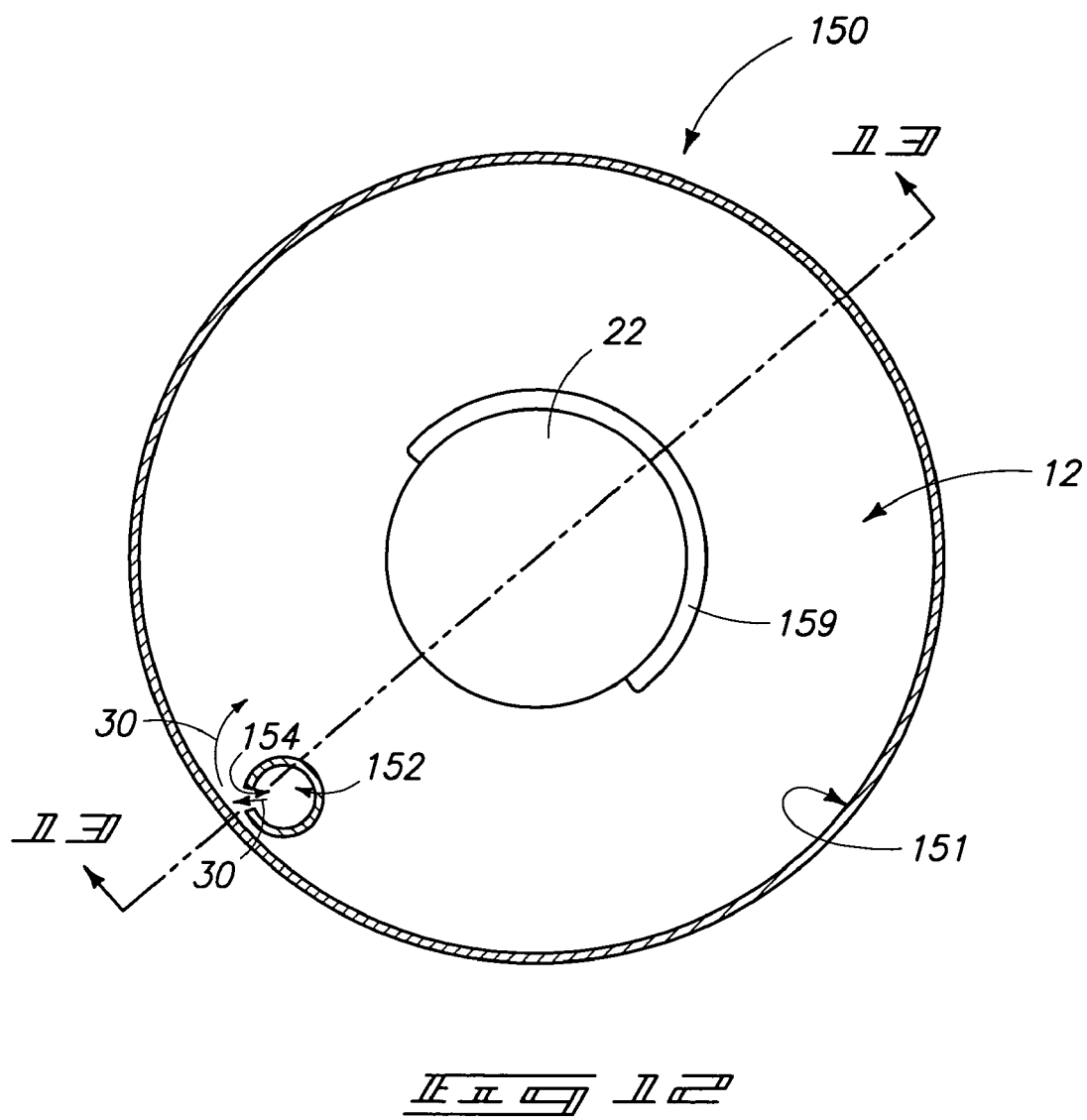
FIG. 12 is a diagrammatic, cross-sectional top view of another deposition apparatus which can be utilized in accordance with another aspect of the present invention, with the apparatus being shown having a semiconductor substrate retained therein.
Figure 13:
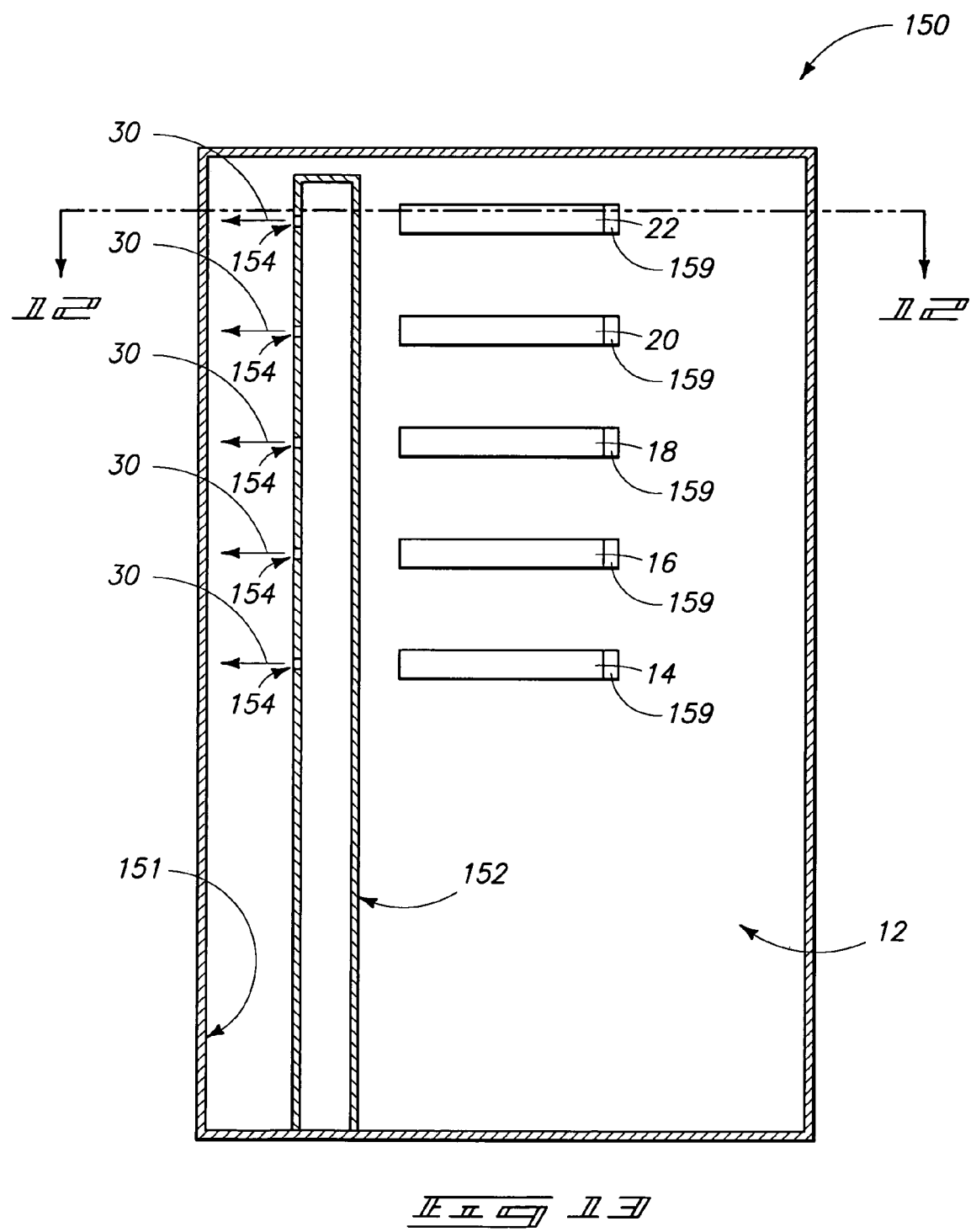
FIG. 13 is a diagrammatic, cross-sectional side view of the deposition apparatus of FIG. 12.
Figure 14:
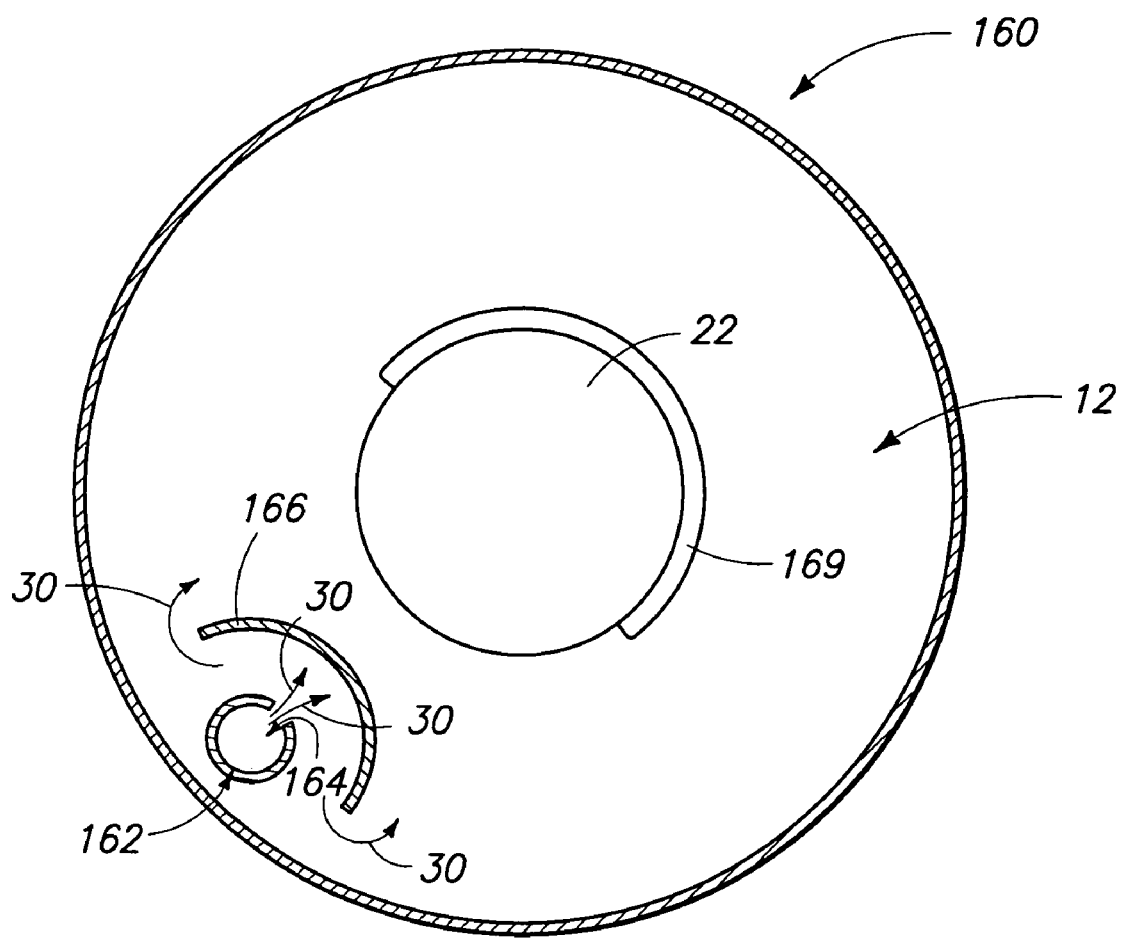
FIG. 14 is a diagrammatic, cross-sectional top view of another deposition apparatus which can be utilized in accordance with an aspect of the present invention, with the apparatus being shown having a semiconductor substrate retained therein.

FIG. 14 shows a cross-sectional top view of a deposition apparatus 160 having a configuration similar to that of the apparatus 150 of FIG. 12. The apparatus 160 comprises a reaction chamber 12. A substrate holder 169 is within the apparatus, and a semiconductor wafer substrate 22 is shown retained within the holder. The apparatus 160 comprises an inlet tube 162 having a port 164 extending therein. Further, the apparatus 160 also comprises a heated plate 166 in front of the port 164. The shown plate 166 is a curved plate that extends partially around the inlet tube 162. In other aspects (not shown) the plate 166 can extend entirely around the inlet tube. If the plate 166 extends entirely around the inlet tube, the plate can have an opening at the bottom and/or top so that precursor can flow past the plate. Alternatively, or additionally, the plate can have various openings formed therein so that the precursor can penetrate the plate, and in some aspects, the plate can comprise at least a portion which is a screen that allows precursor to flow therethrough.

A stream 30 of precursor is shown being directed toward the plate 166 from the inlet port 164. The stream then migrates around the plate, and toward the semiconductor wafer substrate 22. Plate 166 can function analogously to the plate 102 of FIG. 8 to permit undesired side reactions of materials within stream 30 to occur prior to flow of the stream 30 to substrate 22.

Figure 15:
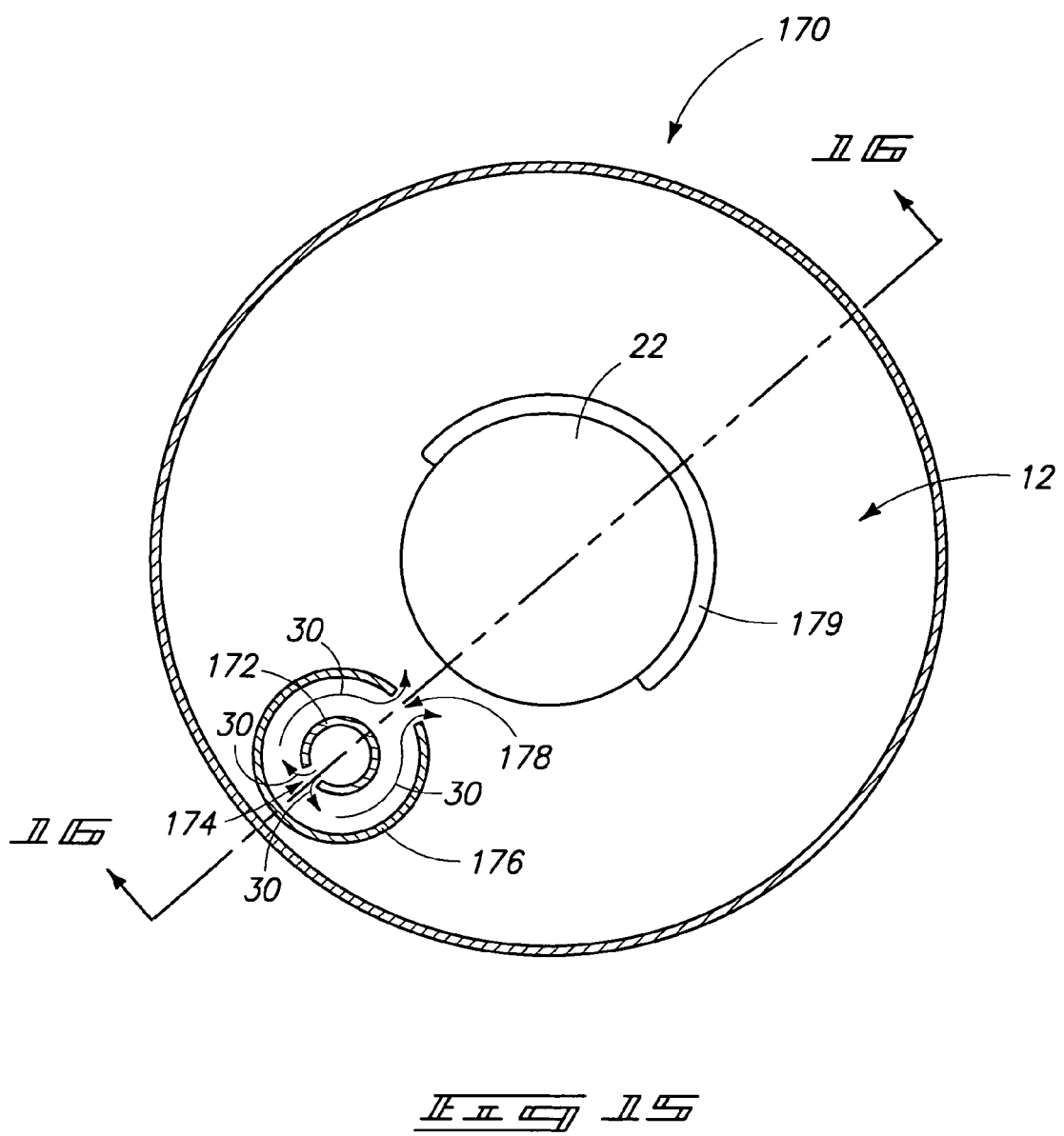
FIG. 15 is a diagrammatic, cross-sectional top view of another deposition apparatus which can be utilized in accordance with an aspect of the present invention, with the apparatus being shown having a semiconductor substrate retained therein.

FIGS. 15 and 16 show a deposition apparatus 170 illustrating another aspect of the invention. The apparatus 170 comprises a reaction chamber 12. A substrate holder 179 is within the apparatus, and a semiconductor wafer substrate 22 is shown retained within the holder. An inlet tube 172 is within the chamber, and the inlet tube comprises ports 174. The inlet tube can be considered an inlet nozzle, and the inlet ports are orifices in a sidewall of such nozzle. A tube 176 entirely surrounds the inlet nozzle such that the inlet nozzle directs deposition material within stream 30 to contact a wall of the tube 176. The tube 176 has at least one orifice 178 extending therethrough. In operation, the stream 30 of deposition material circulates within the inside of the tube 176, and then exits from the tube through the orifices 178 to migrate toward substrates 14, 16, 18, 20 and 22. Tube 176 can be heated, and an interior surface of the tube can then function analogously to the surface 103 of FIG. 8 to enable side reactions of materials within stream 30 to occur prior to the stream migrating to the substrates.

The tube 176 can extend entirely around the inlet nozzle, or can extend substantially entirely around the inlet nozzle. Also, the tube can have a single orifice 178 therethrough, a few orifices extending therethrough, or in some aspects the tube can comprise at least a portion which is a screen and accordingly can have many orifices therethrough for exit of precursor stream 30.

Among the advantages of the apparatuses and methods of the present invention relative to the prior art apparatuses and methods discussed above with reference to FIGS. 4-7, are that the boats 62 tend to be expensive and are a consumed material. In contrast, reaction chamber modification to accomplish the methods of the present invention can be done economically. Also, the heated surfaces utilized in methodologies of the present invention may last much longer than the boats utilized in the prior art methodologies.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A deposition method, comprising:
providing a stack of semiconductor substrates within a reaction chamber of a deposition apparatus;
heating the semiconductor substrates to a first temperature within the reaction chamber;
providing a surface within the reaction chamber that is heated to at least about the first temperature; the surface being spaced from the stack of semiconductor substrates by a distance;
flowing deposition material toward the surface and thereafter toward the stack of semiconductor substrates; the deposition material interacting with the heated surface so that side reactions occur; the side reactions generating one or more problematic products; the distance between the heated surface and the stack of semiconductor substrates being sufficient so that substantially none of the one or more problematic products reaches the stack of semiconductor substrates;
wherein the deposition material is flowed toward the stack of semiconductor substrates through a port that is a last port along the path of deposition material flow; and
wherein the heated surface is a surface of a plate provided in the reaction chamber between the port and the stack of semiconductor substrates.

2. The method of claim 1 wherein the heated surface of the plate curves at least partially around the port.

3. A deposition method, comprising:
providing a stack of semiconductor substrates within a reaction chamber of a deposition apparatus;
heating the semiconductor substrates to a first temperature within the reaction chamber;
providing a surface within the reaction chamber that is heated to at least about the first temperature; the surface being spaced from the stack of semiconductor substrates by a distance;
flowing deposition material toward the surface and thereafter toward the stack of semiconductor substrates; the deposition material interacting with the heated surface so that side reactions occur; the side reactions generating one or more problematic products; the distance between the heated surface and the stack of semiconductor substrates being sufficient so that substantially none of the one or more problematic products reaches the stack of semiconductor substrates; and wherein:
an inlet port is within the reaction chamber and the deposition material is flowed into the reaction chamber through the inlet port;
the inlet port is an orifice in sidewall of an inlet nozzle;
a tube substantially entirely surrounds the inlet nozzle such that the inlet port directs the deposition material to contact a wall of the tube;
the tube has at least one opening extending therethrough into the chamber, and the deposition material passes through said at least one opening of the tube and into the deposition chamber after being directed into contact with the wall of the tube; and
the wall of the tube is the heated surface.

4. A deposition method comprising:
providing a deposition apparatus having one or more semiconductor substrates retained therein; the apparatus including: a reaction chamber, an inlet port configured for injecting fluid into the reaction chamber, and a heated surface within the reaction chamber and proximate the inlet port; the one or more semiconductor substrates being within the reaction chamber;
heating the one or more semiconductor substrates to a first temperature within the apparatus, and heating the heated surface to a second temperature which is at least about the same as the first temperature;
providing a bulk flow of one or more precursors through the inlet port, toward the heated surface, and thereafter toward the one or more semiconductor substrates; the inlet port being a last port along a path of the bulk flow of the precursors;
the bulk flow of the one or more precursors interacting with the heated surface for a sufficient time so that undesired side reactions occur prior to the bulk flow migrating beyond the heated surface toward the one or more semiconductor substrates; and
wherein the heated surface is a surface of a plate provided in the reaction chamber between the inlet port and the one or more semiconductor substrates.

5. The method of claim 4 wherein the heated surface of the plate curves at least partially around the inlet port.

6. A deposition method, comprising:
providing a deposition apparatus having one or more semiconductor substrates retained therein; the apparatus including; a reaction chamber, an inlet port configured for injecting fluid into the reaction chamber, and a heated surface within the reaction chamber and proximate the inlet port; the one or more semiconductor substrates being within the reaction chamber;
heating the one or more semiconductor substrates to a first temperature within the apparatus, and heating the heated surface to a second temperature which is at least about the same as the first temperature;
providing a bulk flow of one or more precursors through the inlet port, toward the heated surface, and thereafter toward the one or more semiconductor substrates;
the bulk flow of the one or more precursors interacting with the heated surface for a sufficient time so that undesired side reactions occur prior to the bulk flow migrating beyond the heated surface toward the one or more semiconductor substrates; and wherein:
the inlet port is an orifice in sidewall of an inlet nozzle;
a tube substantially entirely surrounds the inlet nozzle such that the inlet port directs the bulk flow of the one or more precursors into a wall of the tube;
the tube has at least one opening extending therethrough into the chamber and the one or more precursors pass into the chamber through the at least one opening after being directed into the wall of the tube; and
the wall of the tube is the heated surface.

* * * * *